(12) United States Patent
Hsu et al.

(10) Patent No.: US 7,750,441 B2
(45) Date of Patent: Jul. 6, 2010

(54) CONDUCTIVE INTERCONNECTS ALONG THE EDGE OF A MICROELECTRONIC DEVICE

(75) Inventors: Rockwell M. Hsu, Phoenix, AZ (US); Thomas S. Dory, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 628 days.

(21) Appl. No.: 11/479,611

(22) Filed: Jun. 29, 2006

(65) Prior Publication Data

US 2008/0001269 A1   Jan. 3, 2008

(51) Int. Cl.
*H01L 29/40* (2006.01)
(52) U.S. Cl. ............... 257/621; 257/753; 257/762; 257/773; 257/774; 257/E23.145; 257/E21.577

(58) Field of Classification Search ......... 257/620–621, 257/698, 513, 762, 773, 774, 753, 783, E23.011, 257/E23.067, E23.145, E21.577, E21.578; 438/637–640, 668
See application file for complete search history.

(56) References Cited

U.S. PATENT DOCUMENTS

| 4,978,639 | A | * | 12/1990 | Hua et al. ............... 438/465 |
| 5,600,101 | A | * | 2/1997 | Sakai .................. 174/261 |
| 5,969,422 | A | * | 10/1999 | Ting et al. .............. 257/762 |
| 6,035,528 | A | * | 3/2000 | Sasaki et al. .............. 29/874 |
| 6,287,949 | B1 | * | 9/2001 | Mori et al. .............. 438/612 |
| 6,924,551 | B2 | | 8/2005 | Rumer et al. |
| 2004/0207049 | A1 | * | 10/2004 | Bauer et al. ............. 257/620 |

* cited by examiner

*Primary Examiner*—Jasmine J Clark
(74) *Attorney, Agent, or Firm*—David L. Guglielmi

(57) ABSTRACT

Embodiments of the invention include apparatuses and methods relating to conductive interconnects along the edges of a microelectronic device. In one embodiment, the conductive interconnect has the shape of a half cylinder.

6 Claims, 3 Drawing Sheets

CONDUCTIVE INTERCONNECTS ALONG THE EDGE OF A MICROELECTRONIC DEVICE

TECHNICAL FIELD

Embodiments of the invention relate to microelectronics processing and packaging technology. In particular, embodiments of the invention relate to interconnects between a microelectronic device and a package substrate.

BACKGROUND

After a microelectronic chip or device has been manufactured, it is typically packaged before it is sold. The package system provides, among other things, electrical connection to the chip's internal circuitry. In some package systems, a chip having an active front surface and a back surface opposite the active surface is mounted to a package substrate by the chip's back surface. Electrical connection is then made between the package substrate and conductive elements on the active surface for ground, power, and input/output (I/O) signal. In some systems, the electrical connections include wire bonds that are electrically connected to the active surface of the device, and extend away from the active surface and loop to an electrical connection on the package substrate. In other systems, a chip is "flip-chip" connected to a package substrate. In a flip-chip package, electrical leads on the die are distributed on its active surface and the die is turned over, or flipped, such that the leads on the active surface are electrically connected to corresponding leads on a package substrate.

Package systems including wire bonds and/or flip-chip connections have numerous problems. Wire bonds, due to their length, have poor parasitic inductance performance (parasitic inductance being proportional to the length of the interconnect) which may necessitate numerous wire bonds to adequately reduce inductance. The large number of required wire bonds increases assembly costs and enlarges the package substrate footprint required for the device, which further increases costs and also limits their usefulness in high density applications. Flip-chip connections, although they offer less parasitic inductance, do not allow devices to be stacked, which is often desired in high density small form factor package systems.

BRIEF DESCRIPTION OF THE DRAWINGS

The invention is illustrated by way of example and not by way of limitation in the figures of the accompanying drawings, in which the like references indicate similar elements and in which.

DETAILED DESCRIPTION

In various embodiments, apparatuses and methods relating to conductive interconnects along the edges of microelectronic devices. However, various embodiments may be practiced without one or more of the specific details, or with other methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

In microelectronic package systems, it is desirable to provide electrical connections between conductive lands on the active surface of the device and the package substrate that are short (in order to provide low parasitic inductance for the microelectronic system), reliable, and manufacturable with repeatedly with high yields. Briefly, the present description provides structures and methods that enable short and reliable interconnects between the active area of a device and a package substrate by providing conductive interconnects along the edges of a microelectronic device. The conductive interconnects are formed by first providing an open through via at the edge of a device. Then, a conductive layer is selectively formed within the through via, and the device is diced along its edge and through the via to form the conductive interconnect along the edge of the device. The conductive interconnect provides the advantages of direct, short routing between the package substrate and the active surface, manufacturability, and reliability.

FIGS. 1-11 illustrate methods and structures for forming a microelectronic device having a conductive interconnect along its edge.

Figure 1:
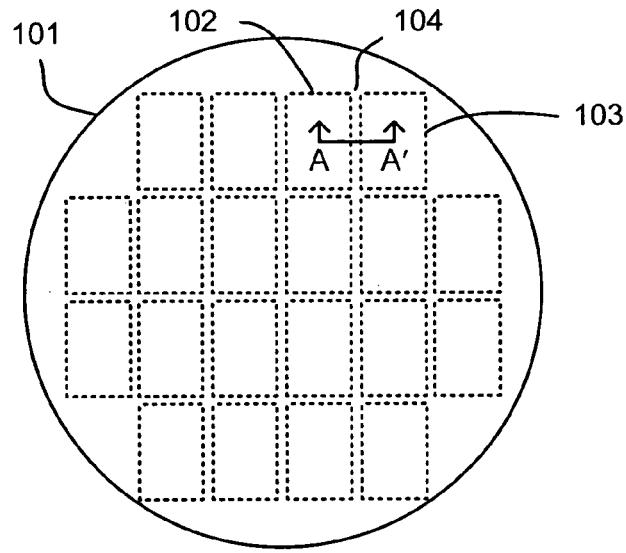
FIG. 1 is a top down illustration of a substrate wafer including numerous microelectronic devices and scribe lines between the devices.

FIG. 1 illustrates a top down view of a substrate wafer 101 having formed thereon a plurality of chips or devices, including device 102 and device 103. The surface that the devices are formed on is typically considered the active surface and is also be referred to as the top surface or the front surface of the substrate. The surface opposite the active surface is then referred to as the bottom or back surface of the substrate. The devices are typically rectangular or square and are formed in rows and columns on substrate wafer 101. They are separated by scribe lines or streets, including scribe line 104, which separates device 102 and device 103. Substrate wafer 101 is any suitable material for the manufacture of microelectronic chips such as monocrystalline silicon, germanium, gallium arsenide, indium phosphide, or silicon on insulator, or the like, and may be of any size. In one example, substrate wafer 101 is a semiconductor wafer. The devices are formed in and on substrate wafer 101 by known techniques and include devices such as transistors, resistors, and conductors that form integrated circuits. The devices are electrically interconnected by alternating layers of metal lines and conductive vias formed over the devices. The chips formed on substrate wafer 101 may include a wide variety of functional devices including integrated passive devices (IPD), memory devices, or logic devices.

Figure 2:
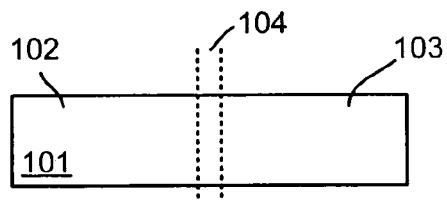
FIG. 2 is a cross-sectional illustration of the substrate wafer of FIG. 1 taken along a line that extends from within a first device across a scribe line and within a second device.

FIG. 2 illustrates a cross sectional view of the structure of FIG. 1 taken at line A-A' and shows device 102 and device 103 formed on substrate wafer 101 and separated by scribe line 104. FIG. 2 shows a simplified view of device 102 and device 103 along the cross section line A-A'. Detailed structures such as devices and metallization layers are not shown for the sake of clarity.

Figure 3:
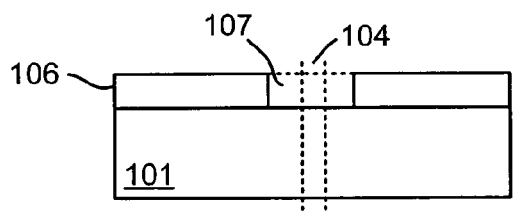
FIG. 3 illustrates the structure of FIG. 2 with a pattern layer including an opening across the scribe line formed over the substrate.

As shown in FIG. 3, a pattern layer 106, including an opening 107, is formed over substrate wafer 101. In FIG. 3, the horizontal dashed line at the top surface of pattern layer 106 indicates an edge of the top surface that is visible from the given cross section. Such dashed lines are used in FIGS. 3-8 for the sake of clarity.

Pattern layer 106 includes any material that can be patterned to form openings that expose a region of substrate wafer 101 and that can substantially block a selective etchant. In one example, pattern layer 106 is photoresist and is formed on the substrate as a bulk layer in a spin on process, and is then exposed and developed in standard photolithography processing to form opening 107. As shown, in one embodiment, pattern layer 106 is formed on the active or top surface of substrate wafer 101. In another embodiment, pattern layer 106 may be formed on the back surface of substrate 101. In such an embodiment, subsequent processing (as described below with reference to FIGS. 4-8) may also be performed on the back surface of substrate wafer 101.

Opening 107 may be any size and shape that facilitates the etching of substrate wafer 101 and the subsequent formation of conductive elements along the edges of the device that connect to conductive elements of the device to provide routing to internal circuitry. In one example, opening 107 extends across scribe line 104. In other examples, opening 107 is along the edge of only one device or multiple openings are provided along the edge of both or multiple devices. Further, from a top down view, opening 107 may have a variety of shapes, including round, oval, square, or rectangular.

Figure 4:
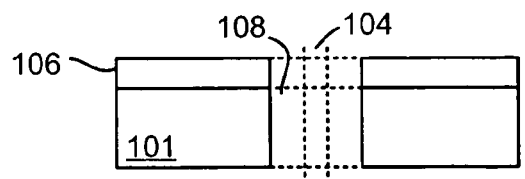
FIG. 4 illustrates the structure of FIG. 3 with the substrate under the opening removed.

Next, as illustrated in FIG. 4, an open via 108 is formed through substrate wafer 101. In FIG. 4, the substrate may appear to be separated into two pieces, however, the through via is formed through an intact substrate—and, as indicated by the horizontal dashed lines, the apparent separation is due only to the chosen cross sectional view line (see FIG. 1).

Open via 108 is formed by any suitable process that removes the substrate material from within the opening in pattern layer 106 and provides substantially vertical sidewalls. In one example, a deep reactive ion etching process is used. In etch processing, the ratio of the depth to the width (the aspect ratio) of the hole or open via that can be formed is often limited. For example, deep reactive ion etch processing of monocrystalline silicon is currently limited to aspect ratios up to about 10 to 1. Therefore, the minimum width of the opening available is limited by the thickness of the substrate. For example, for a monocrystalline substrate having a thickness of about 200 microns, an opening having a minimum width of about 20 to 70 microns can be used. Smaller openings are often desirable because they allow for greater hole density and require less conductive fill material, saving processing time and material costs. Since stock substrate materials typically have thicknesses in the range of about 600 to 800 microns, the substrate may be thinned by back grind processing prior to etching through the substrate to allow for smaller openings. In various examples, the substrate is thinned to thicknesses in the range of about 75 microns to about 300 microns.

In other examples, the substrate is thinned after the formation of a via trench in the substrate to expose the via and provide a via through the thinned substrate. In one example, a hole having a depth of about 280 microns is formed in a substrate having a thickness of about 600 microns. Then, the substrate is thinned to a thickness of about 250 microns to provide an exposed through via. The back side grinding step may therefore occur before processing or at any point in the described processing prior to dicing. Delaying the back side grinding step may offer the advantage of maintaining a thicker and sturdier substrate that is less susceptible to breakage or deformation throughout the processing. Of course, the back side grind processing is optional and may not be required.

Figure 5:
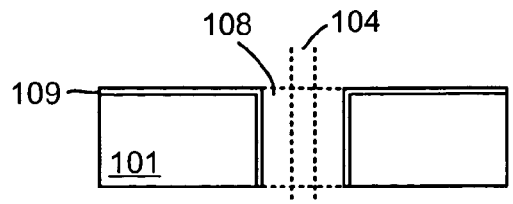
FIG. 5 illustrates the structure of FIG. 4 with the pattern layer removed and a seed layer formed over the substrate and lining the opening.

The method continues, as illustrated in FIG. 5, with the removal of pattern layer 106 and the formation of a seed layer 109. Pattern layer 106 is removed by any suitable technique, such as a wet etch or a dry etch process. Seed layer 109 is formed over substrate wafer 101 and lines opening 108. Seed layer 109 includes any material or stack of materials that will seed the formation of a thick conductive material. In one example, seed layer 109 includes an approximately 500 to 1000 Å thick adhesion or barrier layer of tantalum and tantalum nitride or titanium and nitride films and a seed material formed over the adhesion layer. In another example, seed layer 109 includes a copper seed layer having a thickness of about 5000 Å. The material or materials of seed layer 109 are formed by any suitable technique, such as chemical vapor deposition (CVD), atomic layer deposition (ALD), sputter processing, or evaporation.

Figure 6:
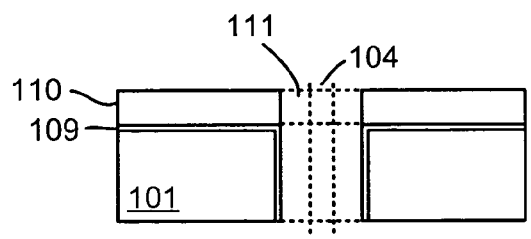
FIG. 6 illustrates the structure of FIG. 5 with a pattern layer including an opening that is aligned with the substrate opening formed over the seed layer.

As illustrated in FIG. 6, a pattern layer 110 having an opening 111 is then formed over seed layer 109. Opening 111 exposes the seed layer lining the opening while covering the remaining portion of the seed layer. Pattern layer 110 includes any suitable material that can be patterned and that can block the formation of a bulk conductor layer where the patterned layer covers the seed layer. In one example, pattern layer 110 includes a photoresist layer that is formed by providing a bulk layer and typical photolithography exposure and develop steps.

Figure 7:
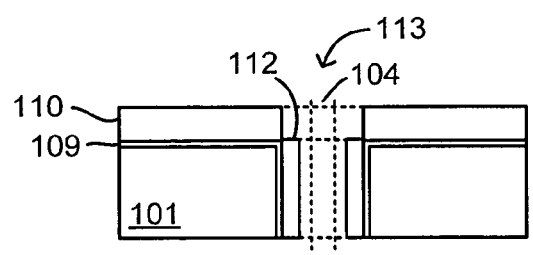
FIG. 7 illustrates the structure of FIG. 6 with a conductive layer formed on the exposed portion of the seed layer.

As illustrated in FIG. 7, a conductive layer 112 is then formed on the exposed regions of seed layer 109 and within the opening, leaving an opening 113. Conductive layer 112 includes any suitable conductive material or materials. In one example, conductive layer 112 includes a thin film of about 5 to 10 microns of copper. As shown, in one example, conductive layer 112 lines the opening over seed layer 109 leaving opening 113. In another example, conductive layer 112 entirely fills the opening as a conductive plug. Conductive layer 112 is formed by any suitable technique, such as an electroplating process.

Figure 8:
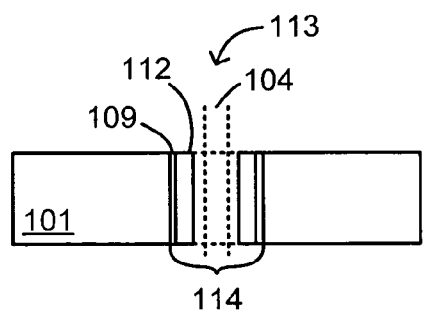
FIG. 8 illustrates the structure of FIG. 7 with the pattern layer and the portion of the seed layer outside of the opening and on the substrate removed.

Next, as shown in FIG. 8, pattern layer 110 and a portion of seed layer 109 are removed to leave a conductive via structure 114. Pattern layer 110 is removed by any suitable technique, such as a wet etch or a dry etch process. Seed layer 109 is also removed by any suitable technique, including wet etch or dry etch processing. In the removal of seed layer 109, a portion of conductive layer 112 may also be removed if there is little or no etch selectivity between the two materials. However, since conductive layer 112 is much thicker than seed layer 109, the bulk of the conductive layer remains.

Figure 9:
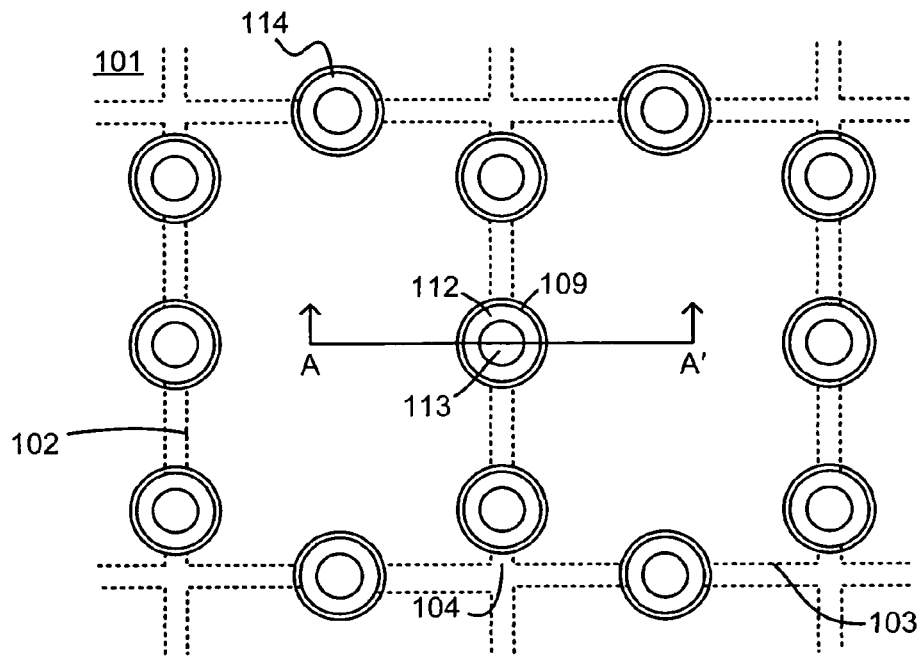
FIG. 9 illustrates a top down view of two microelectronic devices separated and surrounded by scribe lines, with via openings that are partially filled with a conductor layer around the perimeters of the devices.

FIG. 9 illustrates a top down, enlarged, and expanded view of the structure of FIG. 8 and is analogous to the structure of FIG. 1. FIG. 9 illustrates device 102, device 103, scribe line 104, and a plurality of conductive via structures 114 that include seed layer 109, conductive layer 112, and opening 113. As discussed, in some examples, the conductive via structures will not include the opening, but will instead have conductive layer 112 providing a conductive plug. Also as discussed above, the conductive via structures can have a variety of shapes including circular, oval, rectangular, or square. Further, as shown in FIG. 9, a plurality of conductive via structures 114 are formed around the perimeter of each or any of the microelectronic devices. The number of conductive via structures provided is limited only by their size and patterning density. The conductive via structures are shown approximately centered at the scribe line. In other examples, the conductive via structures are off center with respect to the scribe line and along the edge of the microelectronic devices.

Figure 10:
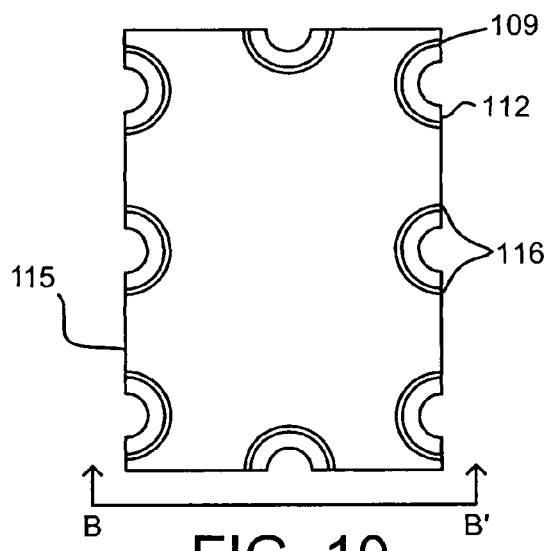
FIG. 10 illustrates the structure of FIG. 11 with one of the microelectronic devices diced and having conductive structures around its perimeter.

Next, as illustrated in FIG. 10, the microelectronic devices are diced or separated to form a diced microelectronic device 115 having conductive interconnects 116 that include a seed layer 109 and conductive layer 112. In one example, the dicing step includes a wafer saw cutting through the substrate along the scribe line between the devices and through the conductive vias. More generally, the substrate is split or divided at or near an edge of a single device and through the conductive vias to form conductive interconnects along the edge of the device. As shown, in one example, a single conductive via provides two conductive interconnects for adjacent devices. In another example, a single conductive via at a corner provides four conductive interconnects for adjacent devices.

Conductive interconnects 116 extend from the active or top surface of the device to the back surface of the device with the conductive material within a via hole. The shape of the via hole will depend on the shape of the previously formed open through via. In various examples, the via hole includes a half cylinder shape, a square or rectangular cut out, or many others. Similarly, the shape of the conductor within the via hole will depend on the shape of the via hole. As described above, in one example, the conductor lines the via hole and therefor has two opposing sides that have the approximate shape of the via hole. In another example, the conductor has a side that is along the edge of the via hole and approximates its shape, and an opposing side that is planar with the edge of the device.

Figure 11:
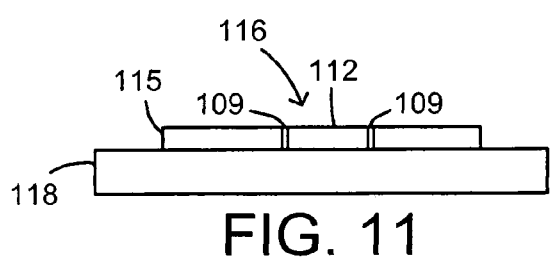
FIG. 11 illustrates the structure of FIG. 10 with the diced microelectronic device mounted on a package substrate.

As illustrated in FIG. 11, the diced microelectronic device is then mounted to a package substrate 118. FIG. 11 illustrates a view of the device taken at line B-B' in FIG. 10. The device is attached to the substrate by any typical surface mount technology processing, including solder reflow, conductive adhesion, and the like. Microelectronic device 115 is mounted with its back surface on package substrate 118. The conductive interconnect extends from the back surface of device 115 to the active surface, and can carry ground, power, or input/output (I/O) signals between device 115 and package substrate 118. On the active surface of the device, conductive interconnect 116 electrically connects to an electrode, a land, a metallization layer, or a bump, or any conductive element that is interconnected to the devices of the device. On the back side or package side of the device, the conductive interconnect electrically connects to an electrode, land or metallization on the package substrate, or to a metal back plane on the backside of the device. Therefore, the plurality of conductive interconnects can transmit a variety of signals between the device and the package, including power, ground, or I/O signals.

Further, since the structure of FIG. 11 includes a device mounted by its back surface to a package substrate, it facilitates the stacking of devices. In one example, additional devices are stacked above microelectronic device 115 and mounted by their back sides to microelectronic device 115. The stacked additional devices may include interconnects along their edges, through silicon vias, or wire bond interconnects. In some examples, conductive interconnect 116 may provide electrical routing for the device or devices stacked on microelectronic device 115.

The conductive interconnects described herein offer short, reliable, and manufacturable interconnection between the active surface of a device and the back side of the device or package substrate. In various implementations, the interconnects may be used in conjunction with other interconnect structures including through silicon vias and wire bonds. Further, although described in a back side surface mount implementation, the interconnects may be used in front side attachment packages, including flip-chip packages.

Reference throughout this specification to "one embodiment" or "an embodiment" means that a particular feature, structure, material, or characteristic described in connection with the embodiment is included in at least one embodiment of the invention. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments.

It is to be understood that the above description is intended to be illustrative, and not restrictive. Many other embodiments will be apparent to those of ordinary skill in the art upon reviewing the above description. The scope of the invention should, therefore, be determined with reference to the appended claims, along with the full scope of equivalents to which such claims are entitled.

What is claimed is:

1. An apparatus comprising:
a microelectronic device having an active front surface and a back surface opposite the active front surface;
a via hole along an edge of the microelectronic device extending from the front surface of the microelectronic device to the back surface of the microelectronic device; and
a conductive fill within the via hole that is conductively coupled to a conductive land on the active surface of the microelectronic device, wherein the conductive fill comprises copper, and wherein the conductive fill comprises an adhesion layer on the via hole, a seed layer on the adhesion layer, and a bulk conductive layer on the seed layer.

2. The apparatus of claim 1, wherein the conductive fill has a first surface along the via hole and a second surface opposite the first surface, the first surface and the second surface having the shape of a half cylinder.

3. The apparatus of claim 1, wherein the conductive fill has a first surface along the via hole and a second surface opposite the first surface, the first surface having the shape of a half cylinder and the second surface being substantially planar.

4. The apparatus of claim 1, farther comprising:
a package substrate conductively coupled to the conductive fill.

5. The apparatus of claim 4, wherein the conductive fill provides a signal line for the microelectronic device.

6. The apparatus of claim 4, wherein the conductive fill provides a ground line for the microelectronic device.

* * * * *